United States Patent [19]

Fitzgerald et al.

[11] Patent Number: 4,746,966
[45] Date of Patent: May 24, 1988

[54] LOGIC-CIRCUIT LAYOUT FOR LARGE-SCALE INTEGRATED CIRCUITS

[75] Inventors: Joseph M. Fitzgerald; Pho H. Nguyen; Robert R. Williams, all of Rochester, Minn.

[73] Assignee: International Business Machines Corporation, Armonk, N.Y.

[21] Appl. No.: 789,868

[22] Filed: Oct. 21, 1985

[51] Int. Cl.⁴ .................. H01L 23/48; H01L 29/44; H01L 29/52; H01L 29/60
[52] U.S. Cl. ........................................ 357/68; 357/40; 357/45; 357/65; 357/70
[58] Field of Search ............... 357/40, 45, 41, 42, 357/68, 70, 45 M, 65

[56] References Cited

U.S. PATENT DOCUMENTS 3,558,992  1/1971  Heuner et al. ............... 357/40
4,413,271 11/1983  Gontowski, Jr. et al. ....... 357/40

FOREIGN PATENT DOCUMENTS 53-78185  11/1978  Japan ................... 357/45 M
58-110063  6/1983  Japan ................... 357/40
59-197151 11/1984  Japan ................... 357/45 M
60-121756  6/1985  Japan ................... 357/40
60-144958  7/1985  Japan ................... 357/45 M

OTHER PUBLICATIONS

Saigo et al, "A Triple-Level Wired 24K-Gate CMOS Gate Array", IEEE Journal of Solid-State Circuits, vol. SC-20, No. 5, Oct. 1985.

Primary Examiner—Andrew J. James
Assistant Examiner—Ngan Ngo
Attorney, Agent, or Firm—J. Michael Anglin

[57] ABSTRACT

A VLSI chip has multiple annular rings of circuit cells, interspersed with annular wiring channels for interconecting the cells. Another wiring layer runs perpendicular to the rings. A central chip area contains all the I/O connections for the chip.

16 Claims, 7 Drawing Sheets

LOGIC-CIRCUIT LAYOUT FOR LARGE-SCALE INTEGRATED CIRCUITS

BACKGROUND OF THE INVENTION

The present invention relates to semiconductor integrated circuits, and more particularly concerns a physical configuration for the elements of a very large scale integration (VLSI) chip.

Presently available digital VLSI chips use a "master image" or "master slice approach" in which individual logic circuits are laid out in predefined cells and then wired together with a multi-layer pattern of conductors to achieve the final overall design. The chips themselves are rectangular, usually nearly square in shape.

Prior-art chips configure the individual logic cells in a series of straight columns across the chip. The columns are separated by straight wiring bays containing the inter-cell conductors. A group of input/output (I/O) cells contain higher-powered drivers and signal-conversion receivers for coupling to off-chip circuits. These cells are placed around the periphery of the chip, where they can be made larger and can connect to pins or other external contacts leading away from the chip.

This configuration has several problems. The centers of the wiring bays tend to fill up with conductors while the ends are still relatively unused, wasting space at the ends—or, alternatively, requiring wider bays and thus fewer logic cells on the chip. Also, prior chips usually use only two levels of wiring, although present technology would permit three. With the usual almost-square overall chip shape, columnar layouts need about the same number of conductors along the wiring bays as across them; a third level would provide space for many more wires in one direction than in the other, so much of it would remain empty. A further problem concerns thermal cycling. As the chip heats an cools, it expands and contracts, usually at a different rate than the substrate to which it is mechanically (as well as electrically) coupled. Placing the contacts at the outside of the chip maximizes the stresses between chip and substrate during cycling, because their distances from a "neutral point" (DNP) on the chip is great. Even when the actual off-chip contacts are moved inward to reduce the DNP, wiring space is wasted bussing signals to the interior of the chip and distributing power outward in an inefficient manner. Moreover, prior chip layouts are inflexible, in that a change in chip size with enhanced technology or greater functionality requires a major redesign of almost every physical parameter of the chip: different power bussing, different spacings, and a complete rework of the I/O cells at the periphery. And, of course, changing the I/O cells changes the chip footprint, necessitating a redesign of the substrate wiring. If a third metal layer were used to alleviate this problem, it would have to be dedicated almost entirely for I/O wiring, leaving very little for signal wiring.

A few chip layouts have used other than straight columns of cells and other than wholly peripheral I/O cells. These approaches, however, have not addressed the above problems, and have not alleviated them in any significant way. U.S. patent application Ser. No. 533,383 to L. B. Caldwell, et al, describes L-shaped columns of logic cells each having a single bend, and a chip having such columns in quadrants, giving an overall cross shape. The purpose of this configuration is to provide greater wiring flexibility. Power is bussed conventionally, and the I/O cells remain at the periphery. U.S. Pat. No. 3,751,720 to Nestork shows a circular chip layout. The cells lie in wedge-shaped segments, and the I/O cells are peripheral. Circuit density is necessarily low, and additional similar cells cannot be accommodated at all. U.S. Pat. No. 3,714,527 to Schmidt arranges random circuits in a circle around a central on-chip heater. The purpose of this is merely to achieve a known, constant chip temperature for electrical accuracy. Japanese kokai No. 53-78185 of Fujitsu K.K. shows a single rectangular array of driver circuits separated from a chip periphery by a single wiring bay, and a method of connecting the drivers to each other.

SUMMARY OF THE INVENTION

The present invention provides a flexible, expandable VLSI chip having a small DNP, efficient power bussing, and high utilization of wiring areas.

Broadly, the invention conceives a chip having all the I/O cells in a single central area, along with the off-chip power and signal contacts. All the logic cells lie in a peripheral area surrounding the central area. Three levels of metal carry interconnections between the logic cells.

Placing the I/O cells in a central area allows the off-chip contacts to be centrally located (i.e., a low DNP) for greatly reduced thermal stress, and still have short power and signal leads to the high-power I/O cells. Adding more logic cells in a larger chip entails no redesign: the power busses are merely extended, and the external footprint remains the same.

Other advantages, as well as modifications within the scope of the present invention, will become apparent from the following description of a preferred embodiment.

DESCRIPTION OF PREFERRED EMBODIMENT

Figure 1:
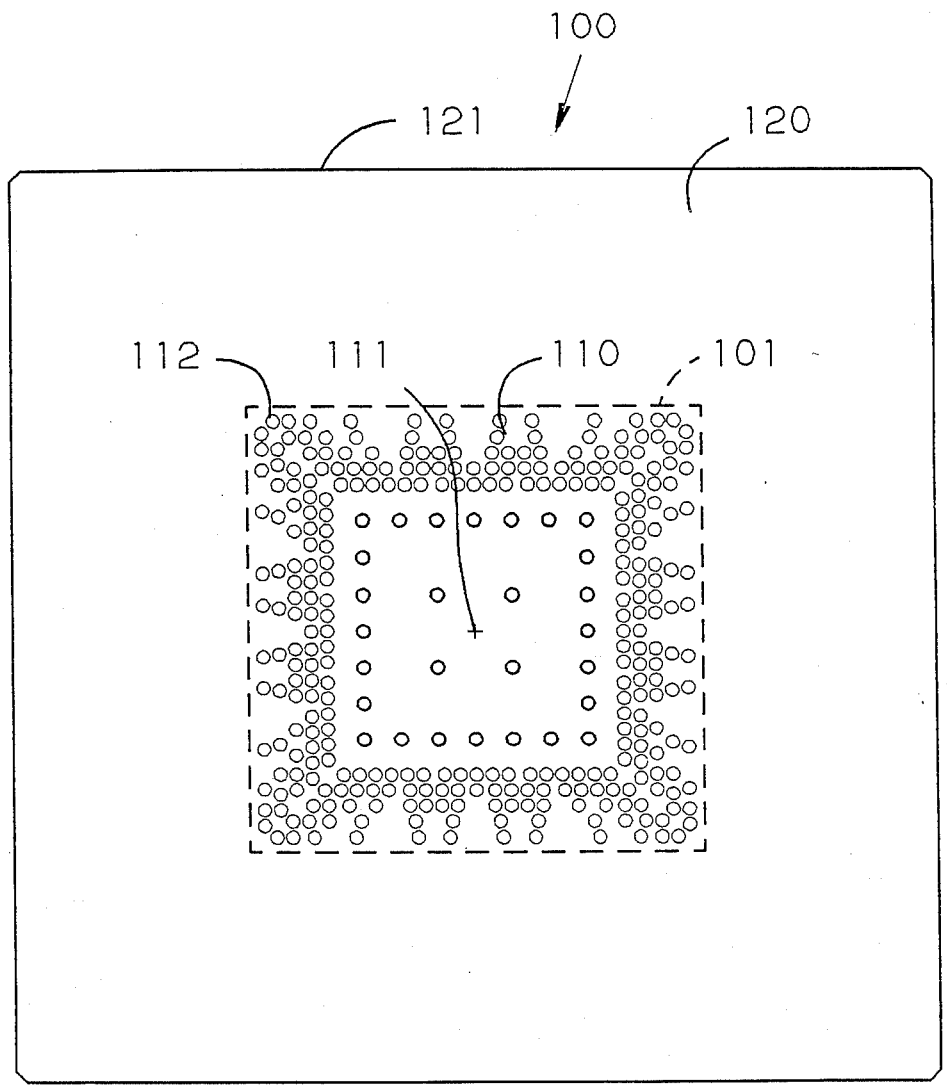
FIG. 1 is a top view of a semiconductor chip constructed according to the invention.

FIG. 1 shows the top of a rectangular semiconductor chip 100 laid out according to the invention. The fabrication of this chip is entirely conventional, and may be done by any of a number of known processes. For the present purposes, the chip may be a MOS technology having three layers of metal interconnection wiring, and input/output (I/O) contacts using controlled-collapse chip connects (C4), sometimes referred to as solder-ball contacts.

From the outside, the chip has a generally rectangular central area 110 and a ring-shaped or annular outer area 120 surrounding central area 110 out to the edge 121 of the chip. The boundary between these two areas, which substantially follows the shape of chip 100, is represented by dotted line 101. This boundary is conceptual, and is not a physical feature of the chip itself.

Central area 110 surrounds a neutral point 111, indicated by tic mark 111. This point is a conceptual tool for calculating wiring distances, thermal-expansion distances, and other physical parameters of the chip; the point itself is not a physical feature of the chip. Central Area 110 contains an array of conventional C4 or solder-ball I/O contacts 112 for passing electrical signals and power between chip 100 and a conventional substrate (not shown) of metallized ceramic or other material. The arrangement of contacts 112 is arbitrary, but substantially all of them lie within the boundary 101. Some of the contacts are shown filled in and some are open. The former indicate power inputs, while the latter represent signal inputs and outputs. There is no physical difference between these two type of contacts 112. A few additional solder balls (not shown) may be placed in peripheral area 120, but these merely serve the mechanical purpose of maintaining the chip parallel to the substrate during fabrication.

Semiconductor chips and substrate materials usually have different rates of thermal expansion. Since the distance from the neutral point (DNP) of all the electrical contacts 112 is very much less than the size of chip 100, the resulting thermal stresses are considerably reduced, decreasing the rate of the most common failure mode, contact separation.

Figure 2:
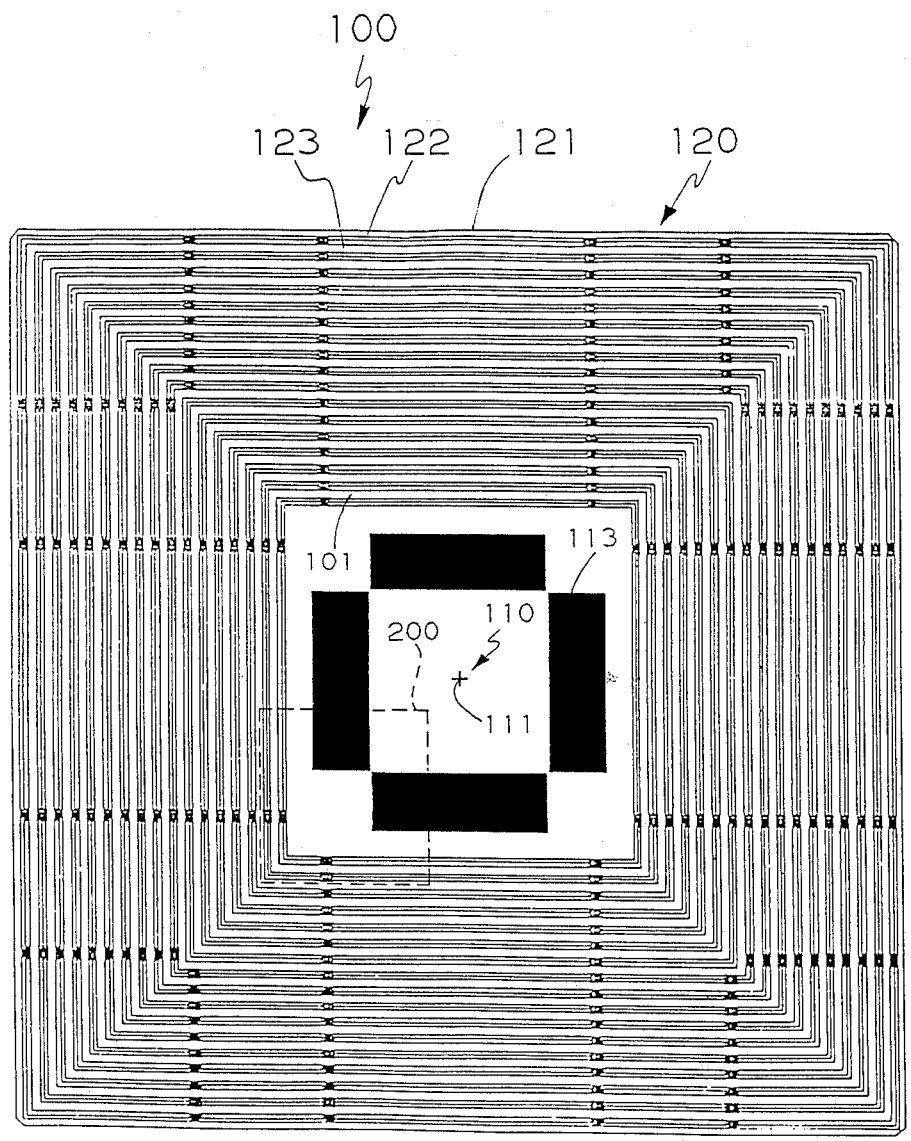
FIG. 2 is a stylized top view of the chip of FIG. 1, showing the cell layouts.

FIG. 2 shows chip 100 at the same scale as in FIG. 1, but at the level of the individual logic and power cells, several levels down.

Central area 110 contains a rectangular ring 113 of I/O cells substantially surrounding neutral point 111. These cells contain driver circuits for repowering signals leaving the chip and receiver circuits for thresholding incoming signals and similar functions. The individual cells are wired to contacts 112 as described later. To give some idea of the dimensions involved, a present technology might use a ring 113 of about 800 microns wide at a DNP of 5000 microns, and has about 250 cells altogether.

Outer area 120 contains a large number of concentric rings 122 of logic cells separated by concentric rings 123 of wiring channels. These rings extend substantially from ring 113 to the outer edge 121 of the chip.

On a representative 12.7 mm chip, the outermost ring 122 might contain about 5000 individual logic cells. A representative chip 100 has about 17 rings 122, each 128 microns wide; wiring channels 123 are about 100 microns wide, affording space for 30 parallel conductors in each channel. The logic circuits in the cells can be personalizable multi-function cells of the type described in commonly-assigned U.S. patent application Ser. No. 457,324 (Fitzgerald).

Boundary 101 between areas 110 and 120 may extend somewhat into the space occupied by logic rings 122 and wiring channels 123, as shown in FIG. 2. This does not appreciably degrade the advantages of the invention, as shown more clearly in FIG. 5.

Figure 2A:
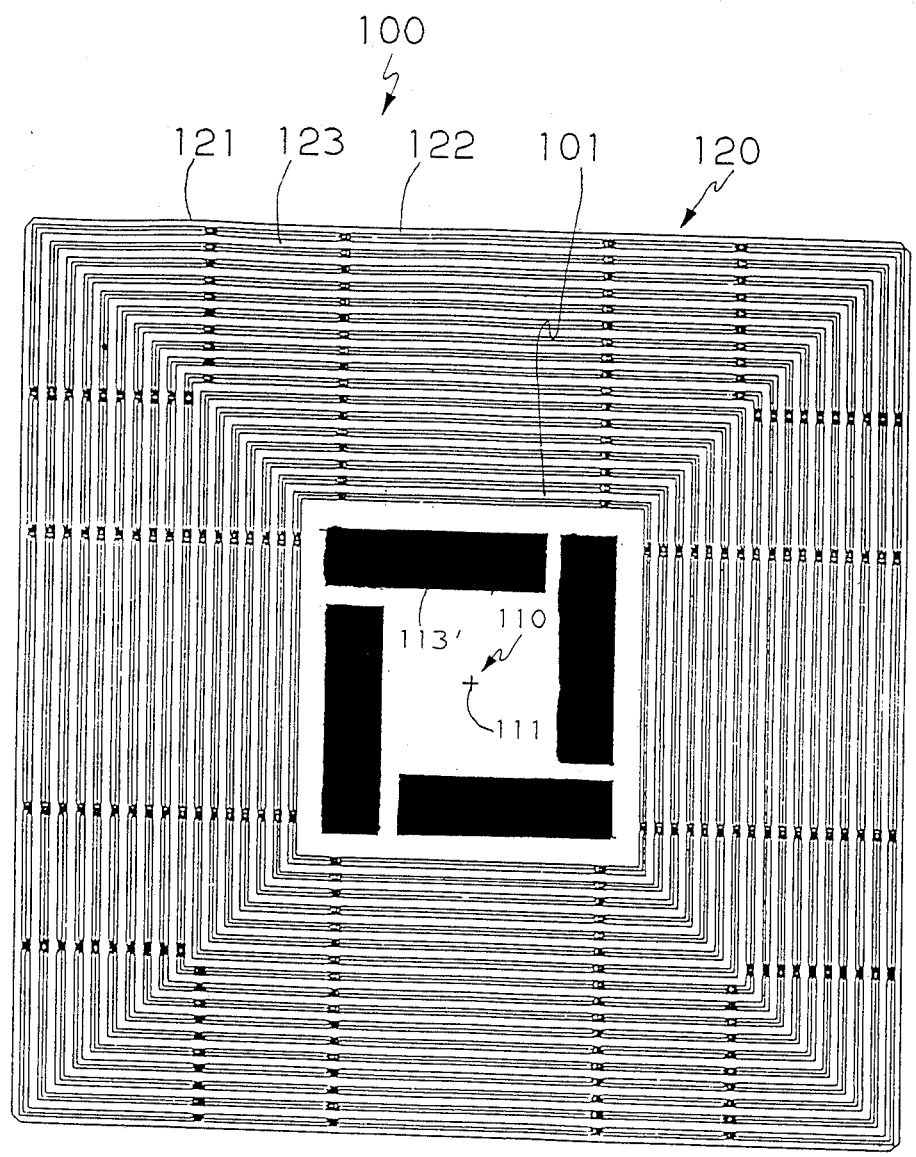
FIG. 2A shows a variation of the cell layouts of FIG. 2.

FIG. 2A shows an alternative design for the I/O cells. Here, ring 113' has a pinwheel shape. This configuration makes somewhat more use of central area 110, which might be desirable in some cases.

Figure 3:
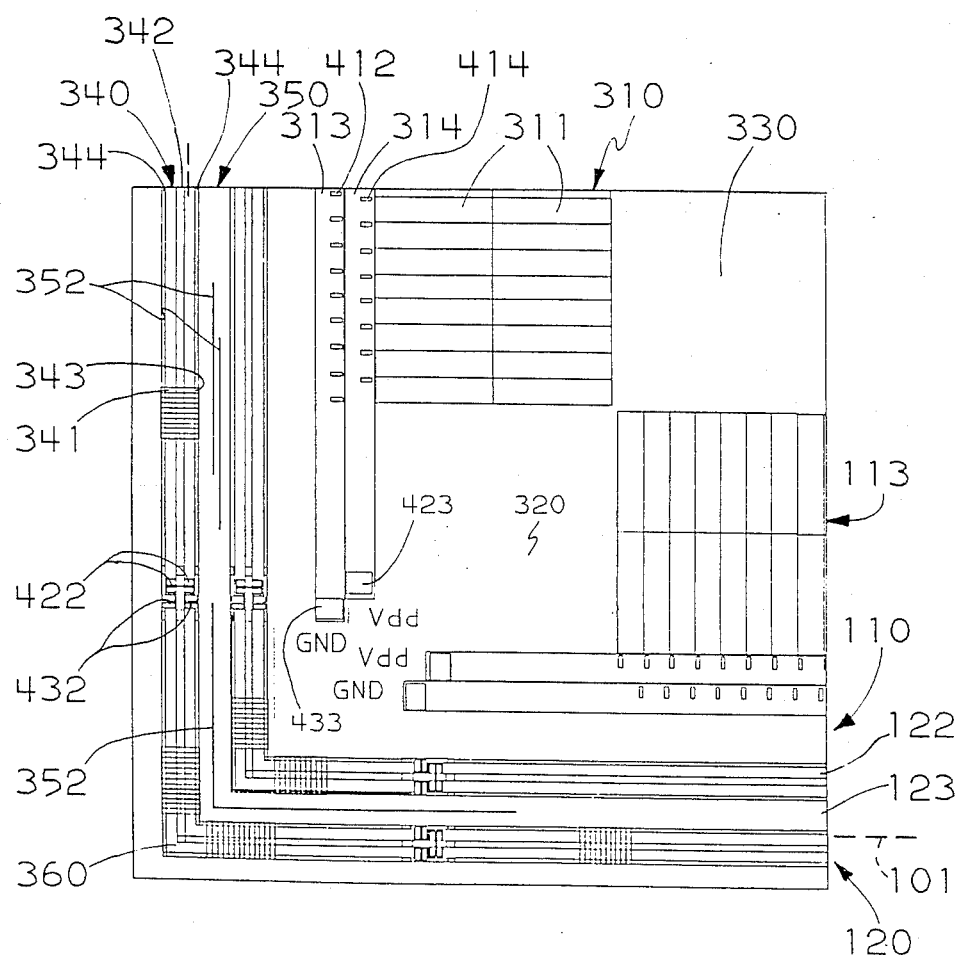
FIG. 3 is an expanded view of the chip, primarily at the first-metal level, but also showing details of the cell layout.
Figure 4:
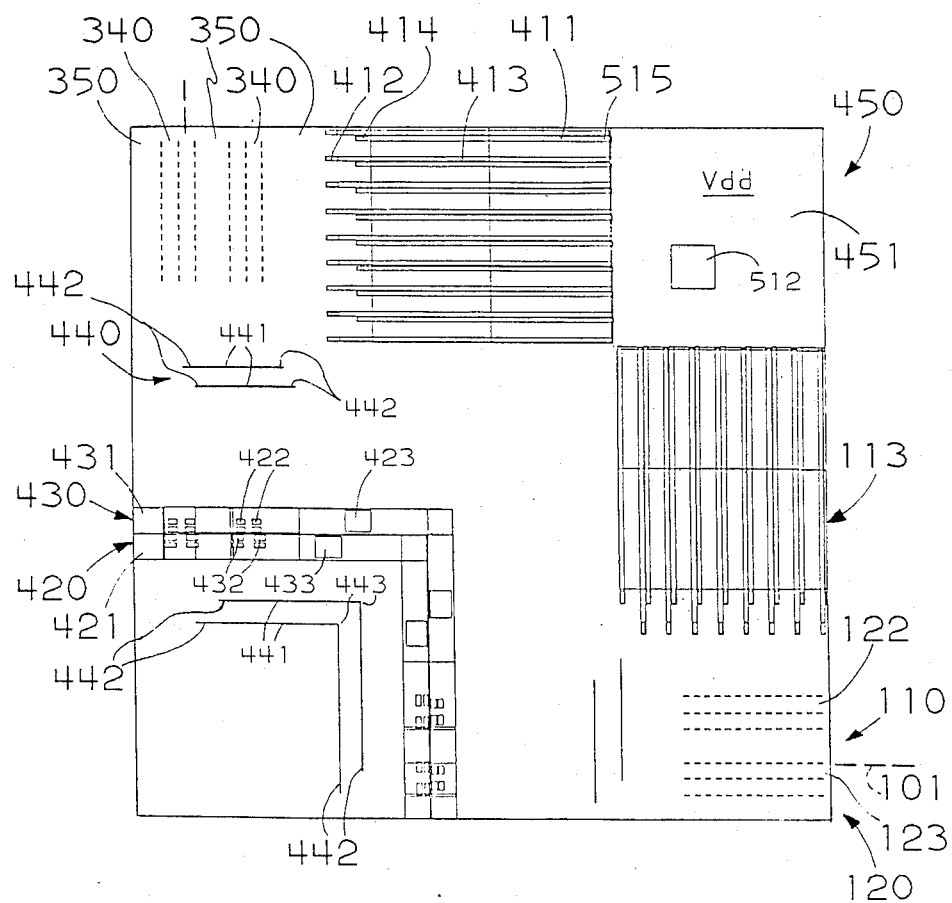
FIG. 4 is an expanded view of the chip at the second-metal level, to the same scale as FIG. 3.
Figure 5:
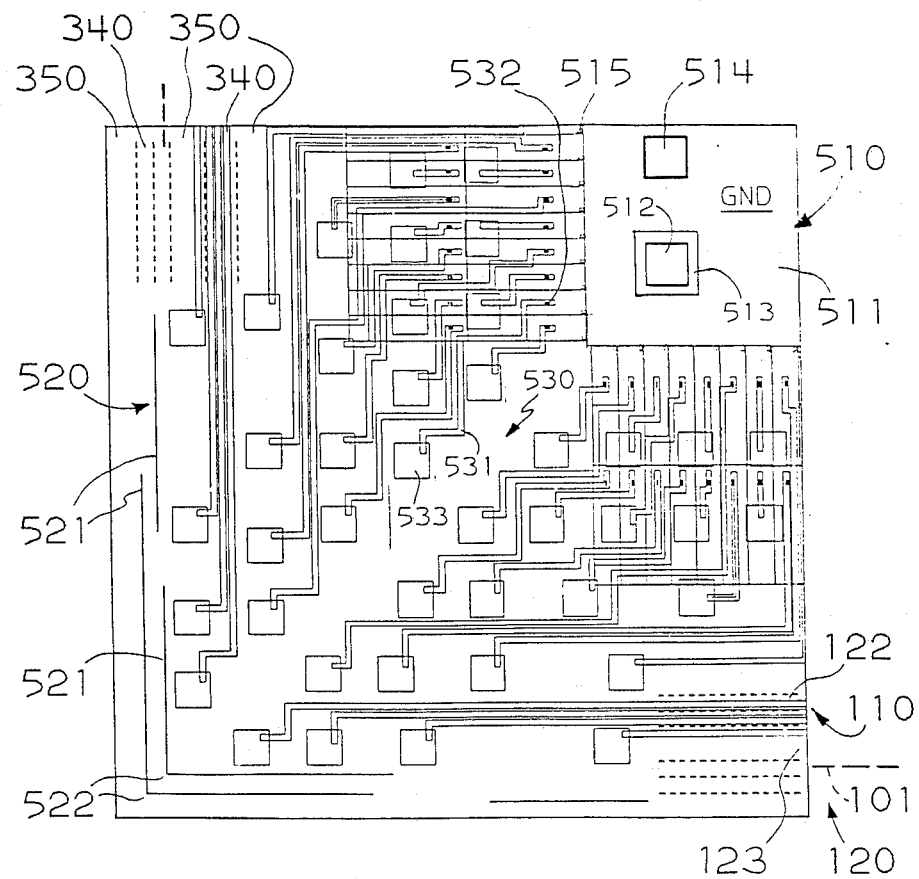
FIG. 5 is an expanded view of the chip at the third-metal level, to the same scale as FIG. 3.

FIGS. 3–5 show an expanded view of a small portion of chip 100, as indicated by the dotted line 200 in FIG. 2. FIG. 3 is primarily drawn at the first of three metal interconnection layers over the cells in rings 113 and 122. For visual reference, however, it also delineates the cell boundaries in the underlying semiconductor layers. FIG. 4 is drawn to the same scale, and shows the second metal layer. FIG. 5, also to the same scale, shows the third metal layer. The first digit of the reference numerals are the same as their Figure numbers.

In central area 110, ring 113 has four arms 310, each comprising a series of long, thin individual I/O cells 311. These cells are placed in pairs, end to end. Discretionary first-metal wiring within each cell personalizes it to perform a particular function. For clarity, this wiring has been omitted from FIG. 3; see FIG. 6. At the sides of each pair, second-metal power Vdd (positive voltage) straps 411 and ground straps 413 run the length of both cells. Heavy first-metal Vdd bus 314 collects the straps 411 through vias 414; first-metal ground bus 313 collects the straps 413 through vias 412. Vias 412 and 414 extend downward from second metal through a conventional insulating layer (not shown) to first metal.

Inner area 450 of the second metal layer contains a Vdd plane 451 having a large number of vias 512 to C4 contacts above the third-metal layer of FIG. 5. Straps 411 tie plane 451 to ground bus 314 as previously described. Inner area 510 of the third metal layer contains a ground plane 511 having multiple vias 514 for connection upward to additional C4 contacts for ground potential. Vias 515 downward to second metal tie ground plane 511 to ground straps 413. Moats 513 in plane 511 isolate vias 512 from plane 511. These large, centrally located Vdd and ground planes, having multiple off-chip contacts, can distribute relatively large currents directly to the I/O cells, and thence by way of multiple parallel straps to busses feeding the remainder of the chip cells. This power-distribution geometry has low losses, low noise, and yet a low interference with other chip wiring.

Corner region 320 between the arms 310 of ring 113 are not used in first metal, although they could be filled with more cells or wiring if desired. Inner region 330 is not needed for power planes. It can be used for test circuits, voltage converters, or other circuits (not shown). These circuits may or may not be laid out in cellular form, and can connect to I/O contacts by means of additional vias (not shown) through the Vdd and ground planes.

In outer area 120, each ring 122 has four arms 340 of logic cells 341 arranged in pairs. Each cell has discretionary wiring in first metal to personalize its function. For clarity, this intra-cell wiring is not shown in FIG. 3; examples can be found in the cited application Ser. No. 818,918 to J. M. Fitzgerald. A Vdd bus 342 runs down the backbone of arms 340, preferably continuous in corner areas 360 to form a complete loop around each ring 122. A ground bus 344 runs down each edge 343 of arms 340, adjacent wiring-bay arms 350. The chip has a total of four heavy second-metal Vdd power busses 420, such as bus 421 in FIG. 4, running perpendicular to first-metal logic-ring busses 344, coupling to them by vias 422. Four similar busses 430, such as bus 431, run alongside busses 420, and couple to wiring-bay ground busses 344 through vias 432. Busses 420 connect to Vdd power busses 314 through vias 423 in corner areas 320. Similarly, busses 430 couple to ground power busses 313 through vias 433. The connections established by vias 423 and 433 also cause busses 313 and 314 to form a complete loop, for lower losses, lower noise, and better load balancing.

Each logic cell has an edge 343 facing one arm 350 of a wiring bay 123. Signal inputs and outputs pass across the cell edges into the wiring-bay arms by means of short conductors (not shown) in a polysilicon layer below first metal. (Alternatively, first or second metal could connect signal wiring to the cells.) First-metal signal conductors 352 couple to these short conductors through vias such as 353. Although the first-metal wiring-bay conductors all run parallel to the bay they occupy—and thus parallel to the adjacent logic-cell arms, they may bend around corners at the ends of the arms, and thus continue for any length in a ring 123. Thus, the annular chip configuration avoids the tendency of prior-art columnar chips to have wiring jams in the middle of the wiring bays and underutilization at the ends. Corner areas 360 could be filled in with cells or wiring, although this would probably not be practical.

Second-metal signal wiring 440 is not constrained to run in discrete wiring bays or areas, since no intra-cell connections are made at this level. For visual reference, however, the locations of arms 340 and 350 are partially indicated by dotted lines in FIG. 4. Individual second-metal conductors 441 run perpendicular to first-metal conductors 352, and connect to them through vias such as 442. And, since conductors 352 bend at corners 360, conductors 441 can also change direction there, as at 443. It is also possible to connect second-level metal directly to logic-cell I/Os at edges 343 by vias (not shown). I/O cells 113 are constructed to have signal connections in a wiring bay 350 just outside Vdd bus 314. These connections are wired in the same manner as the external connections of logic cells 341.

Conductors 521 in third-metal signal wiring 520, then, run above and parallel to cell arms 340 and wiring bays 350, portions of which are shown in dotted lines for visual reference. Signal wiring 520 is confined to outer area 120, that is, outside boundary line 102. Here again, restrictions on the direction and placement of conductors 521 is for the convenience of having orderly wiring rules, since no cell wiring extends to this level. Conductors 521 may bend around corner areas, as at 522, in the same way as first-level wiring 350. They connect to second-level wiring 440 through vias such as 523.

Central area 110 is actually defined by the extent of signal-pad wiring 530, as indicated by the dashed line 101 in FIG. 5. Individual conductors 531 connect to an intra-cell I/O bus in second metal by vias 532, as will be shown in FIG. 6. The other ends of these conductors form pads 533 for solder-ball contacts 112, FIG. 1. Wiring 530 is not constrained to a single direction. This is one of the advantages of having a third metal layer in the invention. And, by confining the wiring between I/O cells in area 110 and logic cells in area 120 to second-metal wiring 440, the pad wiring 530 can be laid out independently of the inter-area wiring requirements. That is, wiring 530 can be laid out almost as though it were on a separate chip. The only interaction occurs where central area 110 overhangs logic-cell and wiring-bay arms 340 and 350 to some extent. In those regions, third-metal signal wiring is preferably prohibited, although it could be merely limited somewhat. Since fewer logic cells occupy the inner rings 122, fewer signal connections are required there in any event. In most chips, the area required for pads and pad wiring exceeds the area of the I/O cells, so the ability of the present configuration to overhang the logic cells is a significant advantage.

Figure 6:
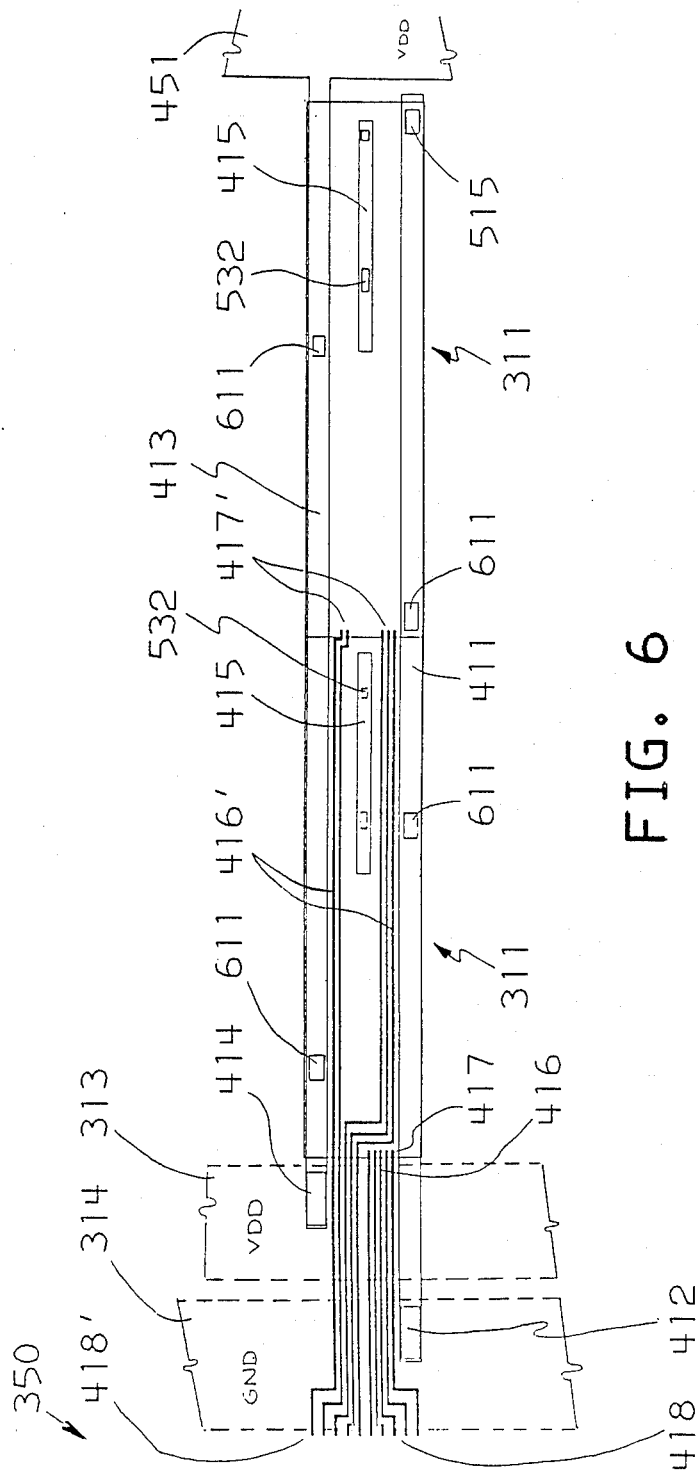
FIG. 6 details the input/output cells and nearby chip areas at several levels.

FIG. 6 details a pair of I/O cells 311 at the second-metal level. For visual reference, first-metal power busses 313 and 314 are shown in dotted lines, as are the outlines of the individual cells below first metal. Vdd power strap 411 runs from Vdd plane 451 to via 414, which leads to Vdd bus 314. Each cell 311 derives its Vdd voltage from this strap at points defined by the particular cell personality, such as at vias 611 descending to first metal or to polysilicon. Likewise, ground strap 413 runs from via 515 to ground plane 511, FIG. 5, to via 412, leading down to ground bus 313. Personality-dependent vias such as 612 couple growing potential to the individual cells 311. The FETs of cells 311 lie below first metal, and all intra-cell wiring (not shown) is at or below first metal in the cell areas.

Inputs and outputs to the pad wiring 530 are made at any position along the length of I/O rails 613, by vias 532 as described previously. These rails couple to the cell circuitry by personality-dependent vias such as 614 to first metal or polysilicon. Signal inputs and outputs to logic cells 341 are made by leads 614 in second metal. These leads extend from the cell edges at 615, where they connect to intra-cell circuits. They end at locations 616 at the edge of the innermost wiring bay 350.

As noted above, details of representative logic-cell configuration may be found in application Ser. No. 457,324 (Fitzgerald).

Some variations in the preferred implementation have been noted passim. Others within the concept of the invention will appear to those skilled in the art.

Having described a preferred embodiment thereof, we claim as our invention:

1. An integrated-circuit chip, comprising:
    a substrate having a central point substantially in the center of the area of said chip, having a single relatively small central area including said central point, and having a much larger peripheral area completely surrounding said central area;
    multiple signal-circuit cells and signal-interconnection means thereamong located in said peripheral area, said cells and interconnection means forming substantially all of the signal circuits and signal interconnections on said chip;
    a ring of multi-device input/output-circuit cells disposed about said central point in said central area;
    conductive means for connecting said signal-circuit cells in said peripheral area to said input/output cells in said central area;
    an array of off-chip contacts located within said central area, said array including substantially all of the off-chip contacts of said chip;
    conductive means for connecting said input/output-circuit cells to said off-chip contacts.

2. A chip according to claim 1, wherein said chip has a generally rectangular overall shape.

3. A chip according to claim 2, wherein said central area generally conforms to the overall shape of said chip.

4. A chip according to claim 1, wherein at least some of said input/output cells have a length in the direction transverse to said ring and a width in the direction along said ring such that said length substantially exceeds said width.

5. A chip according to claim 4, wherein substantially all of said input/output cells have a length in the direction transverse to said ring and a width in the direction along said ring such that said length substantially exceeds said width.

6. A chip according to claim 1, wherein said ring comprises multiple arms, each arm comprising multiple input/output cells disposed in a substantially straight line.

7. A chip according to claim 1, wherein said ring comprises pairs of said input/output cells, the cells in said pairs being disposed radially with respect to said central point.

8. A chip according to claim 1, wherein said chip further comprises:
first and second conductive layers for containing said signal-interconnection means;
a third conductive layer for containing said conductive means for interconnecting said input/output cells to said off-chip contacts.

9. A chip according to claim 8, wherein said third conductive layer contains substantially all of said conductive means for interconnecting said input/output cells to said off-chip contacts.

10. A chip according to claim 8, wherein said third conductive layer further contains a portion of said signal-interconnection means.

11. A chip according to claim 10, wherein said signal-interconnection means portion is substantially confined to said peripheral area of said chip.

12. A chip according to claim 8, wherein said input/output cells include signal connections within said input/output cells, said intra-cell connections being confined to said first and second conductive layers.

13. A chip according to claim 12, wherein at least some of said signal connections within said input/output cells extend to a wiring bay located outside said ring in said central area.

14. A chip according to claim 1, wherein said chip further comprises:
a pair of large-area power planes in said central area;
means for connecting said planes to certain ones of said off-chip contacts in said central area;
multiple radial power straps extending from said power planes to said input/output cells for distributing power thereto.

15. A chip according to claim 14, further comprising a pair of ring-shaped power busses connected to said radial power straps.

16. A chip according to claim 15, further comprising multiple peripheral power busses extending from said ring-shaped power busses and connected to said signal-circuit cells in said peripheral area.

* * * * *